(12) United States Patent
Kim

(10) Patent No.: US 8,218,678 B2
(45) Date of Patent: Jul. 10, 2012

(54) APPARATUS AND METHOD FOR DIGITAL PRE-DISTORTION, SHARING FEEDBACK PATH IN A MULTIPLE ANTENNA WIRELESS COMMUNICATION SYSTEM

(75) Inventor: Seong-Hun Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 736 days.

(21) Appl. No.: 12/357,215

(22) Filed: Jan. 21, 2009

(65) Prior Publication Data

US 2009/0184763 A1   Jul. 23, 2009

(30) Foreign Application Priority Data

Jan. 23, 2008   (KR) .................. 10-2008-0006970

(51) Int. Cl.
*H04K 1/02* (2006.01)
(52) U.S. Cl. ....................................... 375/297
(58) Field of Classification Search .............. 375/296, 375/297
See application file for complete search history.

(56) References Cited

U.S. PATENT DOCUMENTS

| 2004/0246048 A1* | 12/2004 | Leyonhjelm et al. ............. 330/2 |
| 2008/0309405 A1* | 12/2008 | Young et al. .................. 330/149 |
| 2010/0087227 A1* | 4/2010 | Francos et al. ............. 455/562.1 |
| 2010/0118924 A1* | 5/2010 | Pal ............................... 375/219 |
| 2010/0127932 A1* | 5/2010 | Heikkinen et al. ............ 342/374 |

* cited by examiner

*Primary Examiner* — Jaison Joseph
(74) *Attorney, Agent, or Firm* — Jefferson IP Law, LLP

(57) ABSTRACT

A multiple antenna wireless communication system using a DPD power amplifier and a method for controlling an amplitude of an input signal for a plurality of transmission paths of the DPD power amplifier are provided. The system includes a plurality of amplifiers, a plurality of couplers, a switch, a shared feedback path and a plurality of processors. The plurality of amplifiers amplifies an input signal directed to each of the transmission paths. The plurality of couplers couple amplified signals on respective transmission paths. The switch outputs at least one of the amplified signals coupled on the respective transmission paths. The shared feedback path provides the amplified signal output from the switch to a plurality of processors. The plurality of processors compare a feedback signal provided through the shared feedback path with the input signal and pre-distort the input signal such that the input signal and the amplified signal have a linear relation with each other.

20 Claims, 5 Drawing Sheets

APPARATUS AND METHOD FOR DIGITAL PRE-DISTORTION, SHARING FEEDBACK PATH IN A MULTIPLE ANTENNA WIRELESS COMMUNICATION SYSTEM

PRIORITY

This application claims the benefit under 35 U.S.C. §119 (a) of a Korean patent application filed on Jan. 23, 2008 in the Korean Intellectual Property Office and assigned Serial No. 10-2008-0006970, the entire disclose of which is hereby incorporated by reference.

BACKGROUND OF THE INVENTION

1. Field of the Invention

The present invention relates generally to a Digital Pre-Distortion (DPD) power amplifier in a multiple antenna wireless communication system. More particularly, the present invention relates to a DPD power amplifier sharing a DPD feedback path in a multiple antenna wireless communication system.

2. Description of the Related Art

A DPD power amplifier has been designed for improving a non-linear characteristic of a power amplifier. The DPD power amplifier has also been designed to provide a linear relationship between an input and an output signal of the DPD power amplifier by distorting a digital signal before amplifying the digital signal. The structure of the DPD power amplifier for a single transmission path is illustrated in FIG. 1.

As illustrated in FIG. 1, the DPD power amplifier includes a digital up-converter 102, a Peak to Average Power Ratio (PAPR) controller 104, a DPD processor 106, a Digital to Analog Converter (DAC) 108, a high power amplifier 110, a coupler 112, a Band Pass Filter (BPF) 114 and a DPD feedback path 116.

An input baseband digital signal is up-converted into a digital signal in a Radio Frequency (RF) band by the digital up-converter 102. The digital signal in the RF band has a low PAPR by the PAPR controller 104. Also, the digital signal is pre-distorted by the DPD processor 106 and converted into an analog signal by the DAC 108 and amplified by the high power amplifier 110. The signal amplified by the high power amplifier 110 is filtered by the BPF 114 and transmitted via an antenna. Also, a portion of the signal amplified by the high power amplifier 110 is extracted by the coupler 112 and provided to the DPD processor 106 via the DPD feedback path 116. The DPD processor 106 also performs pre-distortion according to the output of the high power amplifier 110 provided via the DPD feedback path 116.

When a transmission end has a plurality of transmission paths, that is, in the case where a multiple antenna technique is applied, a construction for independent DPD for each transmission path is included. In other words, the number of DPD processors 106 and DPD feedback paths 116 are equivalent to the number of transmission paths. Here, the DPD feedback path 116 includes many elements, such as an RF amplifier, an Intermediate Frequency (IF) amplifier, a mixer, an Analog to Digital Converter (ADC), a filter, etc. Since the construction for DPD, for example, the DPD feedback path 116 independently exists on each of the transmission paths, the size and costs of the transmission end increases.

Therefore, a need exists for an apparatus and method for decreasing a size and costs of a plurality of transmission paths of a DPD power amplifier in a multiple antenna wireless communication system.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for preventing an increase in size and costs generated due to a plurality of Digital Pre-Distortion (DPD) feedback paths in a multiple antenna wireless communication system using a DPD power amplifier.

Another aspect of the present invention is to provide an apparatus and a method for allowing a plurality of transmission paths to share one DPD feedback path in a multiple antenna wireless communication system using a DPD power amplifier.

Still another aspect of the present invention is to provide an apparatus and a method for guaranteeing an output of a same amplitude with respect to an input of a same amplitude between transmission paths in the case where the transmission paths share one DPD feedback path in a multiple antenna wireless communication system using a DPD power amplifier.

In accordance with an aspect of the present invention, a Digital Pre-Distortion (DPD) power amplifier apparatus of a transmission end having a plurality of transmission paths in a multiple antenna wireless communication system is provided. The apparatus includes a plurality of amplifiers for amplifying an input signal directed to each of the transmission paths, a plurality of couplers for coupling amplified signals on respective transmission paths, a switch for outputting at least one of the amplified signals coupled on the respective transmission paths, a shared feedback path for providing an amplified signal output from the switch to a plurality of processors, and the plurality of processors for comparing a feedback signal provided through the shared feedback path with the input signal and for pre-distorting the input signal such that the input signal and the amplified signal are linear with each other.

In accordance with another aspect of the present invention, a method for controlling an amplitude of an input signal for a plurality of transmission paths of a DPD power amplifier of a transmission end comprising the plurality of transmission paths in a multiple antenna wireless communication system is provided. The method includes outputting a reference signal to each of the transmission paths, determining a feedback path gain of each transmission path using an amplitude of the reference signal fed back to a corresponding DPD processor after passing through each transmission path, determining an amplitude of an output signal of each transmission path, and controlling the amplitude of the input signal directed to each transmission path such that the amplitude of the input signal directed to each transmission path is proportional to the feedback path gain of the each transmission path.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF THE EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Exemplary embodiments of the present invention provide a technique for allowing a plurality of transmission paths to share a Digital Pre-Distortion (DPD) feedback path in a multiple antenna wireless communication system.

Figure 1:
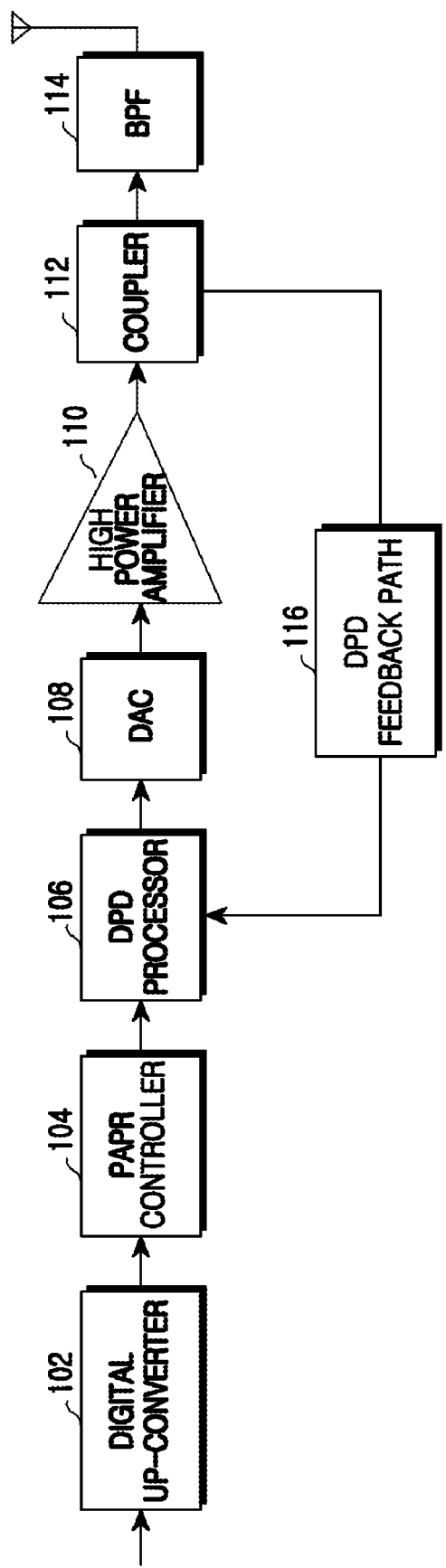
FIG. 1 is a block diagram of a conventional Digital Pre-Distortion (DPD) power amplifier.
Figure 2:
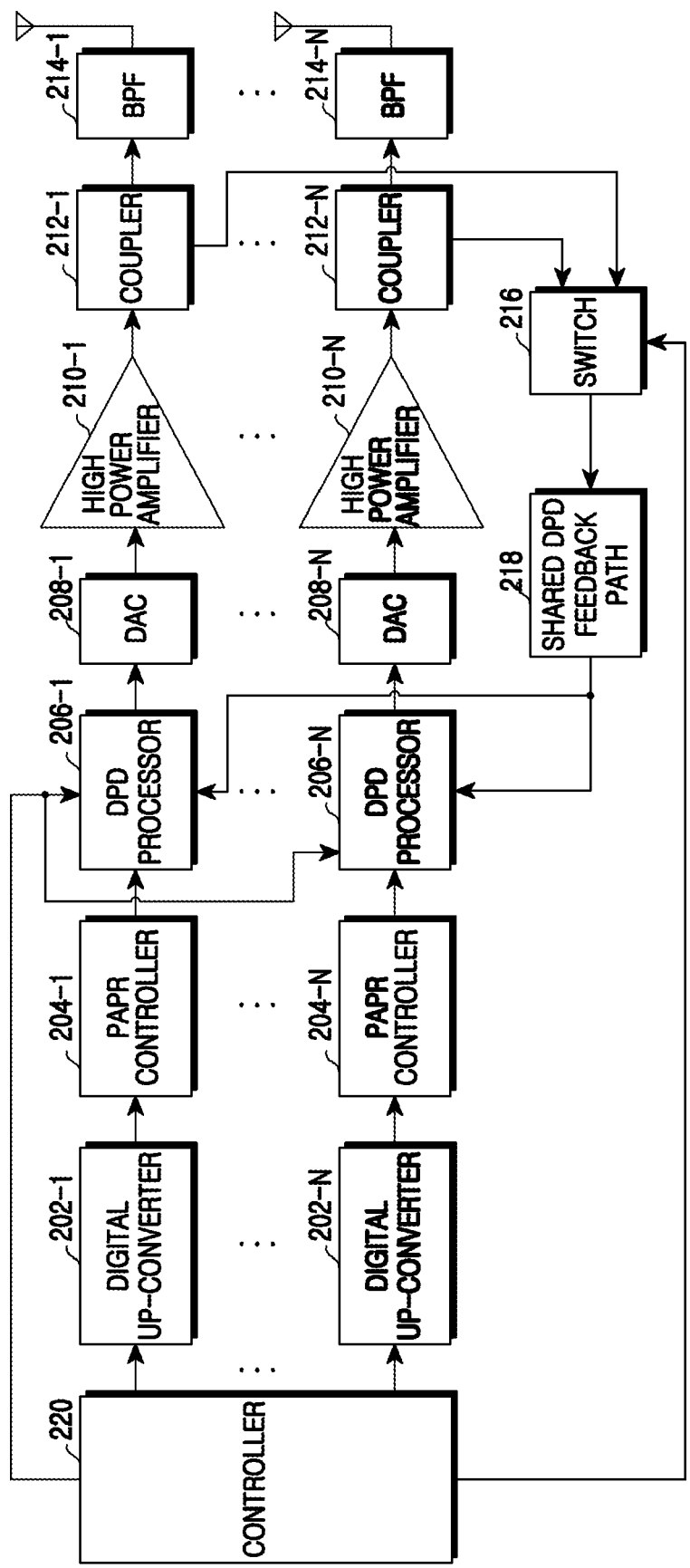
FIG. 2 is a block diagram of a DPD power amplifier in a multiple antenna system according to an exemplary embodiment of the present invention.

The structure of a DPD power amplifier according to an exemplary embodiment of the present invention is illustrated in FIG. 2.

As illustrated in FIG. 2, the DPD power amplifier includes a plurality of digital up-converters 202-1 to 202-N, a plurality of Peak to Average Power Ratio (PAPR) controllers 204-1 to 204-N, a plurality of DPD processors 206-1 to 206-N, a plurality of Digital to Analog Converters (DACs) 208-1 to 208-N, a plurality of high power amplifiers 210-1 to 210-N, a plurality of couplers 212-1 to 212-N, a plurality of Band Pass Filters (BPFs) 214-1 to 214-N, a switch 216, a shared DPD feedback path 218 and a controller 220.

Each of the plurality of digital up-converters 202-1 to 202-N up-converts a baseband digital signal input via a corresponding transmission path into a signal in a Radio Frequency (RF) band. Each of the plurality of PAPR controllers 204-1 to 204-N lowers the PAPR of a transmission signal.

Each of the plurality of DPD processors 206-1 to 206-N compares a feedback signal provided via the shared DPD feedback path 218 with an input digital signal and pre-distorts the input digital signal such that the signal input via the corresponding transmission path and an output of the high power amplifier 210 inside the corresponding transmission path have a linear relationship with each other. At this point, according to an exemplary embodiment of the present invention, each of the plurality of DPD processors 206-1 to 206-N determines whether to operate in response to a control signal. That is, since the DPD feedback path is shared, each of the plurality of DPD processors 206-1 to 206-N may feedback a signal which is not a signal of a corresponding transmission path. Therefore, each of the plurality of DPD processors 206-1 to 206-N operates in response to a control signal informing the plurality of DPD processors 206-1 to 206-N that a signal fed back via the shared DPD feedback path 218 is a signal from the corresponding transmission path.

Each of the plurality of DACs 208-1 to 208-N converts a digital signal of a corresponding transmission path into an analog signal. Each of the plurality of high power amplifiers 210-1 to 210-N amplifies a signal of a corresponding transmission path. Each of the plurality of couplers 212-1 to 212-N couples a portion of the amplified signal of the corresponding transmission path. Here, signals of respective transmission paths coupled by the plurality of couplers 212-1 to 212-N are provided to the switch 216. Each of the plurality of BPFs 214-1 to 214-N filters a signal of the corresponding transmission path into a transmission band and then transmits the filtered signal via an antenna.

The switch 216 has an input versus output relationship of 'N:1'. The switch 216 outputs one of the amplified signals being input from the respective transmission paths to the shared DPD feedback path 218 in response to a control signal provided from the controller 220. According to an exemplary embodiment of the present invention regarding a switching control, the switch 216 is controlled to sequentially output the amplified signals of the respective transmission paths. Alternatively, regarding the switching control, the switch 216 is controlled to output an amplified signal of a specific transmission path at a specific point of time.

The shared DPD feedback path 218 provides the amplified signals of the respective transmission paths output from the switch 216 to the plurality of DPD processors 206-1 to 206-N and includes at least one of an RF amplifier, an Intermediate Frequency (IF) amplifier, a mixer, an Analog to Digital Converter (ADC) and a filter.

The controller 220 outputs a transmission signal to each transmission path. Also, the controller 220 generates control signals applied to the plurality of DPD processors 206-1 to 206-N and the switch 216. In other words, the controller 220 determines an output signal of the switch 216 and controls whether to operate the plurality of DPD processors 206-1 to 206-N. According to an exemplary embodiment of the present invention regarding the switching control, the controller 220 controls the switch 216 to sequentially output the amplified signals of the respective transmission paths. Alternatively, regarding the switching control, the controller 220 controls the switch 216 to output an amplified signal of a specific transmission path at a specific point of time. Also, the controller 220 operates a DPD processor 206 of a transmission path corresponding to an amplified signal output from the switch 216. The controller 220 controls the amplitude of a transmission signal provided to each transmission path such that conditions described below are met.

Although not shown, in the case where a Time Division Duplex (TDD) scheme is applied, a TDD switch is included in each transmission path.

Figure 3:
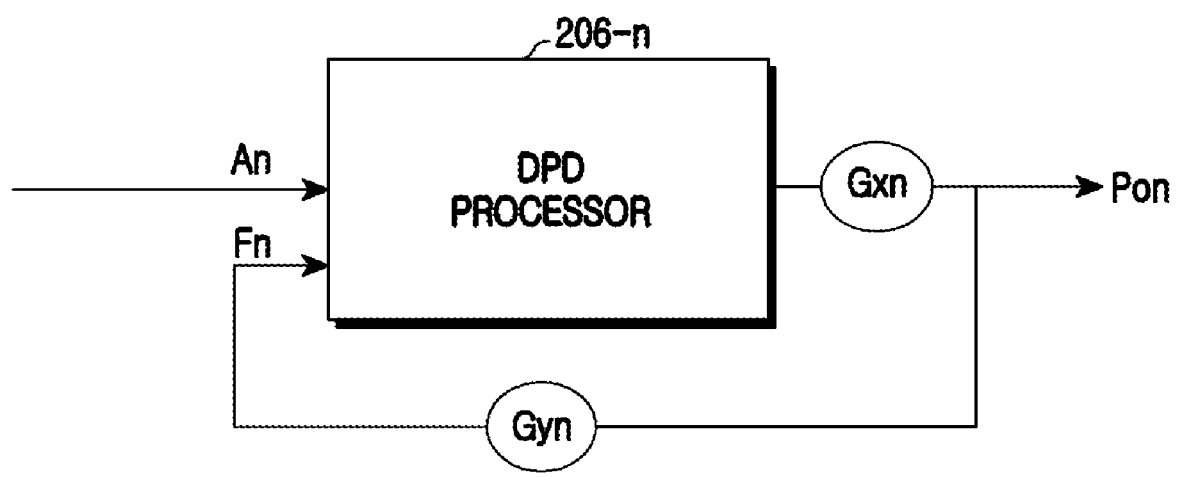
FIG. 3 is a view illustrating a signal amplitude and a path gain inside a DPD power amplifier in a multiple antenna system according to an exemplary embodiment of the present invention.

Hereinafter, for convenience in description, in FIG. 3, the amplitude of signals and path gains input to and output from the blocks shown in FIG. 2 are defined. Referring to FIG. 3, an amplitude of a signal input to a DPD processor 206-$n$ of an n-th transmission path is defined as An, an amplitude of a signal fed back to the DPD processor 206-$n$ via the DPD feedback path is defined as Fn, an amplitude of an output signal of a transmission path is defined as Pon, a path gain from an output terminal of the DPD processor 206-$n$ to an input terminal of a coupler is defined as Gxn, and a path gain from an input terminal of the coupler to a feedback input terminal of the DPD processor 206-$n$ is defined as Gyn.

According to an exemplary embodiment of the present invention, conditions that should be met in the case where a plurality of transmission paths share one DPD feedback path are expressed by Equation (1) below using variables defined in FIG. 3.

$$Pon = Gxn \cdot An (1 \leq n \leq N)$$
$$Pom = Pon (1 \leq m, n \leq m)$$
$$Gxn \cdot Gyn = 1$$
$$\frac{Am}{Gym} = \frac{An}{Gyn}$$
(1)

Pon is an amplitude of an output signal of an n-th transmission path, Gxn is a path gain from an output terminal of a DPD processor to an input terminal of a coupler on an n-th transmission path, An is an amplitude of a signal input to the DPD processor on the n-th transmission path and Gyn is a path gain from an input terminal of the coupler to a feedback input terminal of the DPD processor on the n-th transmission path.

Based on Equation (1), when the amplitude of input signals from the respective transmission paths are substantially the same, the amplitude of output signals should also be the same. A path gain should be '1' while a signal is output from a DPD processor on each transmission path and fed back to the DPD processor via the DPD feedback path.

In the case where the DPD feedback path is shared as in FIG. 2, since gains from input terminals of the couplers to output terminals of the couplers are different from one another, Gyns of the respective transmission paths are different from one another. Therefore, to set Gxn·Gyn of each transmission path to '1', Gxn should be controlled. Accordingly, Gxns of the respective transmission paths become different from one another. That is, the outputs of the same amplitudes with respect to the inputs of the same amplitudes are not met. Therefore, to meet the first condition, the amplitude of a signal input to each transmission path should be controlled such that the amplitude of the input signal is proportional to Gyn of each transmission path. The controlling of the input signal proportional to Gyn is performed by the controller 220. The detailed construction and operation procedure of the controller 220 are described as follows.

Figure 4:
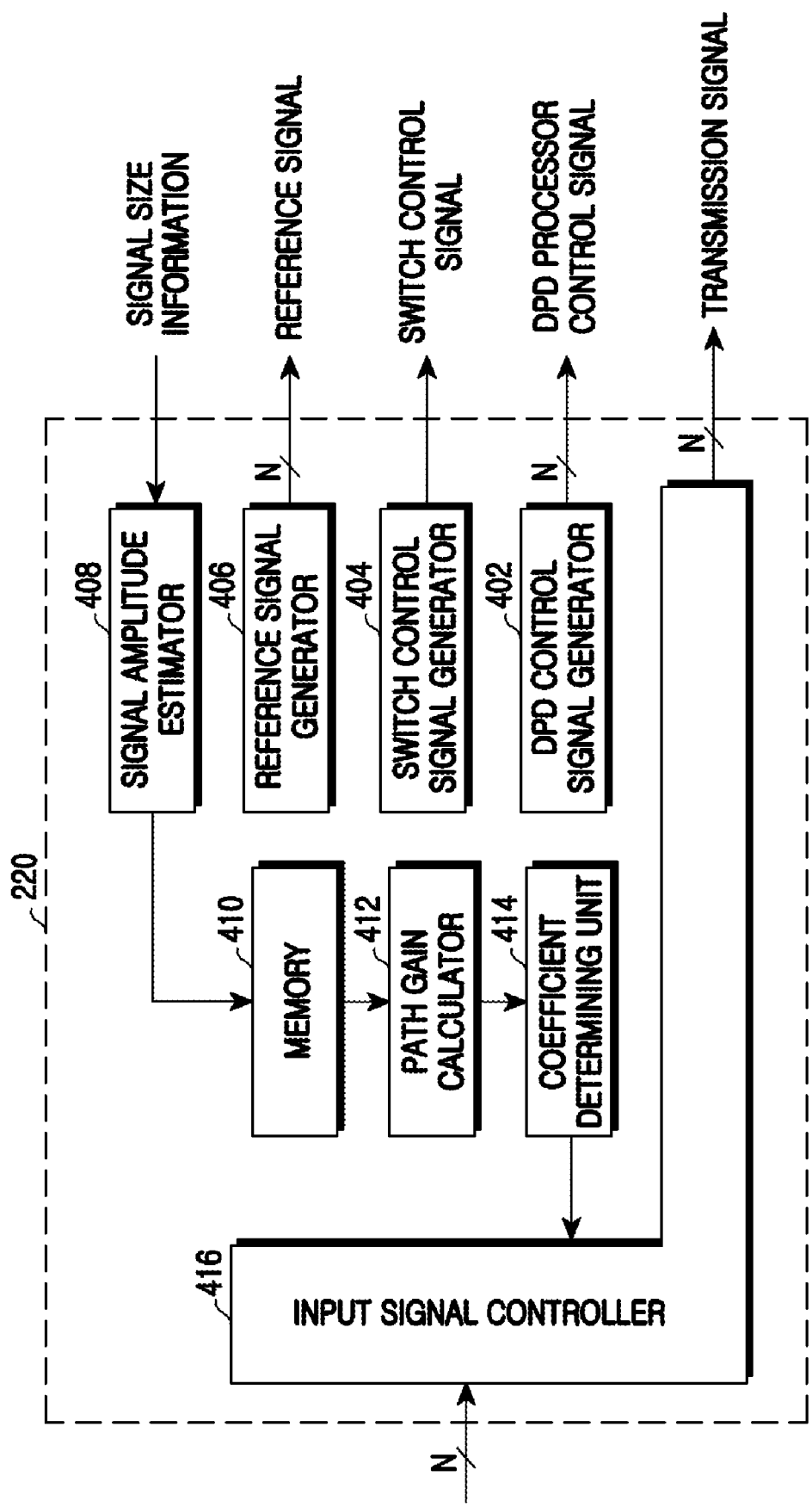
FIG. 4 is a block diagram of a controller of a DPD power amplifier in a multiple antenna system according to an exemplary embodiment of the present invention.

FIG. 4 is a block diagram of the controller 220 inside a DPD power amplifier in a multiple antenna system according to an exemplary embodiment of the present invention.

As illustrated in FIG. 4, the controller 220 includes a DPD control signal generator 402, a switch control signal generator 404, a reference signal generator 406, a signal amplitude estimator 408, a memory 410, a path gain calculator 412, a coefficient determining unit 414 and an input signal controller 416.

The DPD control signal generator 402 generates control signals for operating the DPD processors 206-1 to 206-N of the respective transmission paths. The switch control signal generator 404 generates a control signal for determining an input of the switch 216. The reference signal generator 406 generates a reference signal for determining a feedback path gain. For example, the reference signal may be a continuous single tone, that is, a sine wave.

The signal amplitude estimator 408 estimates the amplitude of a feedback signal and the amplitude of an output signal of each transmission path measured using the reference signal. The amplitude of the feedback signal is measured by each of the DPD processors 206-1 to 206-N on the respective transmission paths. The amplitude of the output signal is measured by an external measuring instrument. The memory 410 temporarily stores information regarding the amplitude of a feedback signal and the amplitude of an output signal of each transmission path estimated by the signal amplitude estimator 408. That is, since a transmission path connected with the shared DPD feedback path 218 is only one at one point, to the transmission path measures all of feedback signal amplitudes of respective transmission paths at a predefined time. Therefore, the memory 410 stores information of a signal amplitude provided from the signal amplitude estimator 408 until all of the feedback signal amplitudes of the respective transmission paths are collected.

The path gain calculator 412 determines a feedback path gain of each transmission path using a feedback signal amplitude and an output signal amplitude of the each transmission path. For example, the feedback path gain is determined using Equation (2) below.

$$Gyn = Fn/Pon$$
(2)

In Equation (2), Gyn is a path gain from an input terminal of a coupler to a feedback input terminal of a DPD processor on an n-th transmission path, Fn is a amplitude of a signal fed back to a DPD processor on the n-th transmission path and Pon is a amplitude of an output signal on the n-th transmission path.

The coefficient determining unit 414 determines a control coefficient for an input signal of each transmission path. In detail, the coefficient determining unit 414 determines a control coefficient for an input signal of each transmission path by searching for a maximum value of feedback path gains for all of the respective transmission paths and dividing a feedback path gain of each transmission path by the maximum value using Equation (3) below.

$$Cn = \frac{Gyn}{Gyk}, \; Gyk = \max\{Gy1, Gy2, Gy3, \ldots, GyN\}$$
(3)

In Equation (3), Cn is a control coefficient of an n-th transmission path, Gyn is a feedback path gain of the n-th transmission path and Gyk is a maximum feedback path gain.

The input signal controller 416 controls the amplitudes of signals input to the respective transmission paths according to control coefficients determined by the coefficient determining unit 414. That is, the input signal controller 416 controls the amplitudes of the input signals according to the determined coefficients such that the amplitudes of the input signals from the respective transmission paths are proportional to feedback path gains. In other words, the input signal controller 416 controls the amplitudes of the signals input to the respective transmission paths such that consequently the amplitude of an input signal of a DPD processor is corrected using Equation (4).

$$An = Cn \cdot Ak \quad (4)$$

In Equation (4), An is an amplitude of an input signal of an n-th transmission path, Cn is a control coefficient of the n-th transmission path and Ak is an amplitude of an input signal of a transmission path having a maximum feedback path gain.

To obtain control, as in Equation (4) with reference to FIG. 4, the input signal controller 416 inside the controller 220 controls the amplitude of an input signal. However, according to an exemplary embodiment of the present invention, the amplitude of an input signal may be controlled by controlling the output gain of the digital up-converter 202. Accordingly, a PAPR threshold of the PAPR controller 204 should be corrected by as much amplitude as the amplitude of an input signal of a DPD processor is corrected. Accordingly, to allow each transmission path to have a uniform characteristic, a same PAPR threshold should be applied for an input signal of a same amplitude. There are two variables determining a PAPR threshold. One of the variables is the amplitude of an input signal and the other variable is a variable designating a peak limit inside the PAPR controller 204. Therefore, to maintain the same PAPR threshold, the peak limit variable inside the PAPR controller 204 should also be corrected by as much amplitude as the amplitude of an input signal is corrected. Therefore, the controller 220 controls peak limit variables of the plurality of respective PAPR controllers 204-1 to 204-N at substantially the same ratios as amplitude control degrees of input signals.

Figure 5:
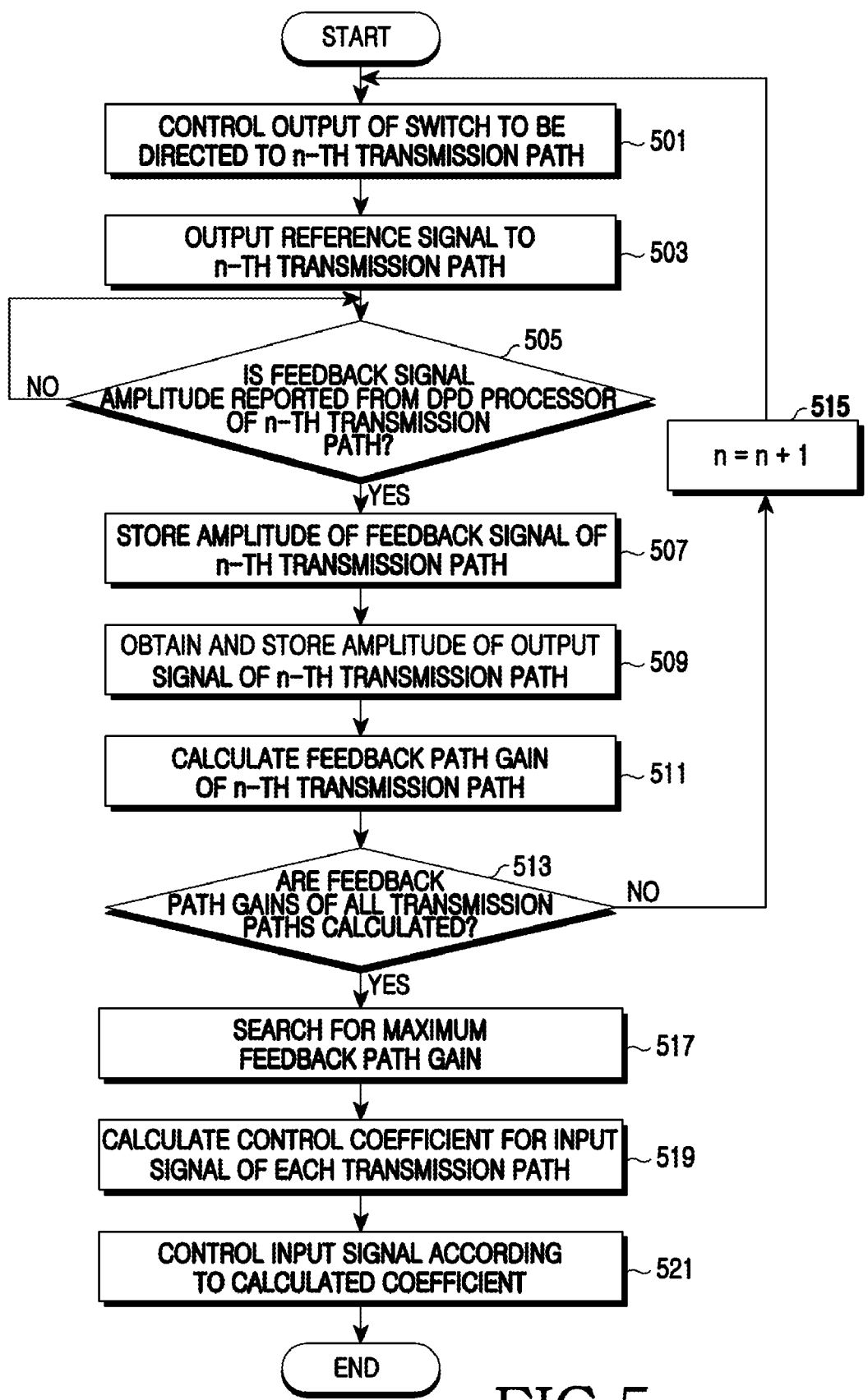
FIG. 5 is a flowchart illustrating an operation procedure for a controller of a DPD power amplifier in a multiple antenna system according to an exemplary embodiment of the present invention.

FIG. 5 is a flowchart illustrating an operation procedure of a controller 220 inside a DPD power amplifier in a multiple antenna system according to an exemplary embodiment of the present invention.

Referring to FIG. 5, in step 501, the controller 220 controls the switch 216 such that an n-th transmission path is connected with the shared DPD feedback path 218. Here, n is initialized to '1'.

Subsequently, in step 503, the controller 220 generates a reference signal for measuring a feedback path gain and outputs the reference signal to an n-th transmission path. For example, the reference signal may be a continuous single tone, that is, a sine wave.

After outputting the reference signal, the controller 220 determines whether a feedback signal amplitude is reported from a DPD processor of the n-th transmission path in step 505. That is, the DPD processor of the n-th transmission path measures the amplitude of the reference signal amplified and fed back and then reports the measured signal amplitude to the controller 220.

When the feedback signal amplitude is reported, the controller 220 stores information of the feedback signal amplitude of the n-th transmission path in step 507. Since a transmission path connected with the shared DPD feedback path 218 is only one at one point, the transmission path measures all of feedback signal amplitudes of respective transmission paths at a predefined time. Therefore, the controller 220 stores information of obtained feedback signal amplitudes until all of the feedback signal amplitudes of the respective transmission paths are collected.

Subsequently, in step 509, the controller 220 obtains the amplitude of an output signal of the n-th transmission path and stores information of the amplitude of the output signal. Here, the amplitude of the output signal is measured by an external measuring instrument.

In step 511, the controller 220 determines a feedback path gain of the n-th transmission path using the feedback signal amplitude and the output signal amplitude. For example, the feedback path gain is determined using Equation (2).

After determining the feedback path gain, the controller 220 determines whether feedback path gains of all transmission paths are determined in step 513. When the feedback path gains of all the transmission paths are not determined, the controller 220 increases n by 1 in step 515, and performs step 501.

On the other hand, when the feedback path gains of all the transmission paths are determined, the controller 220 searches for a maximum value of the feedback path gains for the respective transmission paths in step 517.

After searching for the maximum value, the controller 220 determines a control coefficient for an input signal of each transmission path in step 519. In detail, the controller 220 determines a control coefficient for an input signal of each transmission path by dividing a feedback path gain of each transmission path by the maximum value searched for in step 517, which is expressed by Equation (3).

In step 521, the controller 220 controls input signals according to the above-determined coefficients. That is, the controller 220 controls the amplitudes of the input signals according to the determined coefficients such that the amplitudes of the input signals of the respective transmission paths are proportional to feedback path gains. In other words, the controller 220 controls the amplitudes of the signals input to the respective transmission paths such that consequently the amplitude of an input signal of a DPD processor is corrected using Equation (4).

To obtain control, as in Equation (4) with reference to FIG. 5, the controller 220 controls the amplitude of an input signal in step 521. However, according to an exemplary embodiment of the present invention, the amplitude of an input signal may be controlled by controlling the output gain of the digital up-converter 202. Accordingly, a peak limit variable of the PAPR controller 204 should be corrected by as much amplitude as the amplitude of an input signal of a DPD processor 206 is corrected.

According to the present invention, it is possible to prevent an increase in size and costs generated due to a plurality of DPD feedback paths and a plurality of transmission paths by sharing one DPD feedback path in a multiple antenna wireless communication system using a DPD power amplifier. Also, a difference in an output signal amplitude between transmission paths generated, due to the sharing of one DPD feedback path, may be compensated for by controlling an input signal according to a feedback path gain of each transmission path.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A Digital Pre-Distortion (DPD) power amplifier apparatus of a transmission end comprising a plurality of transmission paths in a multiple antenna wireless communication system, the apparatus comprising:
   a plurality of amplifiers for amplifying an input signal directed to each of the transmission paths;
   a plurality of couplers for coupling amplified signals on respective transmission paths;
   a switch for outputting at least one of the amplified signals coupled on the respective transmission paths;
   a shared feedback path for providing the amplified signal output from the switch to a plurality of processors;
   a controller that is configured to output a reference signal to each of the transmission paths in order to determine a feedback path gain comprising a path gain from an input terminal of a coupler on each transmission path to a feedback input terminal of a respective processor; and
   the plurality of processors for comparing a feedback signal provided through the shared feedback path with the input signal and for pre-distorting the input signal such that the input signal and the amplified signal are linear with each other.

2. The apparatus of claim 1, wherein the shared feedback path comprises at least one of a Radio Frequency (RF) amplifier, an Intermediate Frequency (IF) amplifier, a mixer, an Analog to Digital Converter (ADC) and a filter.

3. The apparatus of claim 1, wherein the controller is configured to control an output direction of the switch and controlling whether to operate the plurality of processors.

4. The apparatus of claim 3, wherein the controller controls the switch to sequentially output the amplified signals of the respective transmission paths.

5. The apparatus of claim 3, wherein the controller controls a processor included in a transmission path corresponding to the amplified signal output from the switch to operate.

6. The apparatus of claim 1, wherein the reference signal comprises a sine wave.

7. The apparatus of claim 1, wherein each of the plurality of processors determines an amplitude of the reference signal fed back via a corresponding transmission path and reports the measured amplitude of the reference signal to the controller.

8. The apparatus of claim 7, wherein the controller determines a feedback path gain of each transmission path using the amplitude of the reference signal fed back to each of the plurality of processors and determines an amplitude of an output signal of each transmission path.

9. The apparatus of claim 8, wherein the controller determines the feedback path gain by dividing the amplitude of the feedback reference signal by the amplitude of the output signal.

10. The apparatus of claim 8, wherein the controller controls an amplitude of the input signal directed to each of the transmission paths such that the amplitude of the input signal directed to each of the transmission paths is proportional to the feedback path gain of each transmission path.

11. The apparatus of claim 10, wherein the controller determines control coefficients for the input signal directed to each of the transmission paths by dividing the feedback path gain of each transmission path by a maximum feedback path gain and controls the amplitude of the input signal directed to each of the transmission paths according to the coefficients.

12. The apparatus of claim 10, wherein the controller controls the amplitude of the input signal directed to each of the transmission paths such that an amplitude of an input signal of each of the plurality of processors is corrected using the following Equation:

$$An = Cn \cdot Ak,$$
$$Cn = \frac{Gyn}{Gyk}, Gyk = \max\{Gy1, Gy2, Gy3, \ldots, GyN\}$$

wherein An comprises an amplitude of an input signal of an n-th transmission path, Cn is a control coefficient of the n-th transmission path, Ak comprises an amplitude of an input signal of a transmission path comprising a maximum feedback path gain, Gyn comprises a feedback path gain of the n-th transmission path and Gyk comprises a maximum feedback path gain.

13. The apparatus of claim 8, further comprising a converter for up-converting the input signal directed to each of the transmission paths into a signal in an RF band and for controlling the amplitude of the input signal directed to each of the transmission paths such that the amplitude of the input signal directed to each of the transmission paths is proportional to the feedback path gain of each transmission path.

14. A method for controlling an amplitude of an input signal for a plurality of transmission paths of a DPD power amplifier of a transmission end comprising the plurality of transmission paths in a multiple antenna wireless communication system, the method comprising:
   outputting a reference signal to each of the transmission paths;
   determining a feedback path gain of the each transmission path using an amplitude of the reference signal fed back to a corresponding DPD processor after passing through each transmission path;
   determining an amplitude of an output signal of each transmission path; and
   controlling the amplitude of the input signal directed to each transmission path such that the amplitude of the input signal directed to each transmission path is proportional to the feedback path gain of each transmission path.

15. The method of claim 14, wherein the reference signal comprises a sine wave.

16. The method of claim 14, wherein the feedback path gain is determined by dividing the amplitude of the feedback reference signal by the amplitude of the output signal.

17. The method of claim 14, wherein the controlling of the amplitude of the input signal of each transmission path comprises:
   determining control coefficients for the input signal directed to each transmission path by dividing the feedback path gain of each transmission path by a maximum feedback path gain; and
   controlling the amplitude of the input signal directed to each transmission path according to the coefficients.

18. The method of claim 14, wherein the amplitude of the input signal directed to each transmission path is controlled such that an amplitude of an input signal of each of the plurality of processors is corrected using the following Equation:

$$An = Cn \cdot Ak,$$
$$Cn = \frac{Gyn}{Gyk}, \quad Gyk = \max\{Gy1, Gy2, Gy3, \ldots, GyN\}$$

wherein An comprises an amplitude of an input signal of an n-th transmission path, Cn comprises a control coefficient of the n-th transmission path, Ak comprises an amplitude of an input signal of a transmission path comprising a maximum feedback path gain, Gyn comprises a feedback path gain of the n-th transmission path and Gyk comprises a maximum feedback path gain.

19. The method of claim 14, further comprising pre-distorting the input signal such that the input signal and an amplified signal from the DPD power amplifier are linear with each other.

20. The apparatus of claim 1, wherein the controller determines control coefficients for the input signal directed to each of the transmission paths as a function of a maximum feedback path gain among feedback path gains of all respective transmission paths.

* * * * *